United States Patent [19]

Olson et al.

[11] Patent Number: 5,004,775
[45] Date of Patent: Apr. 2, 1991

[54] POLYIMIDE RESIN LAMINATES

[75] Inventors: Larry D. Olson, Viroqua; Jeffrey R. Kamla, West Salem, both of Wis.

[73] Assignee: Allied-Signal Inc., Morris Township, Morris County, N.J.

[21] Appl. No.: 413,883

[22] Filed: Sep. 28, 1989

Related U.S. Application Data

[63] Continuation-in-part of Ser. No. 187,158, Apr. 28, 1988, Pat. No. 4,876,325.

[51] Int. Cl.$^5$ .............................................. C08L 79/08
[52] U.S. Cl. .................................... 524/371; 428/435; 428/473.5; 428/901; 528/125; 528/128; 528/170; 528/171; 528/173; 528/205; 528/321; 528/322

[58] Field of Search ............. 524/371; 428/435, 473.5, 428/901; 528/125, 128, 170, 171, 173, 205, 322, 321

[56] References Cited

U.S. PATENT DOCUMENTS 4,876,325 10/1989 Olson et al. ......................... 528/170

Primary Examiner—Harold D. Anderson
Attorney, Agent, or Firm—Harold N. Wells; Jay P. Friedenson; Gerard P. Rooney

[57] ABSTRACT

A thermosetting resin is comprised of (a) a bisimide, particularly a bismaleimide, (b) a polyphenol, particularly a bisphenol, and (c) dicyandiamide. The polyphenol may be styrene-terminated (i.e. a vinyl benzyl ether of a bisphenol). Flame retardance is improved by the addition of octabromodiphenyl oxide.

10 Claims, No Drawings

POLYIMIDE RESIN LAMINATES

CROSS-REFERENCE TO RELATED APPLICATIONS

This application is a continuation-in-part of U.S. Ser. No. 187,158, filed Apr. 28, 1988 now U.S. Pat. No. 4,876,325.

FIELD OF THE INVENTION

The invention relates generally to cross-linked, heat resistant, thermosetting polyimide resins, used in the manufacture of laminates for the electronics industry. More particularly, it relates to a novel polyimide resin which avoids the aromatic diamines now in common commercial use.

PRIOR ART

Thermosetting resins prepared from bisimides and aromatic diamines are in commercial use. In some instances, such compositions are prepared as prepolymers and combined with epoxy compounds and crosslinked with dicyandiamide or other agents.

While resins derived from bisimides and aromatic diamines perform well in electronic laminates, they have several disadvantages. If substitute materials could be found that had improved performance, contained no free aromatic diamines, were less brittle and met UL flammability rating V-O, they should find ready acceptance in the marketplace.

In commonly assigned application Ser. No. 850,660 now abandoned, thermosetting resins are produced by reacting bismaleimides (including a prepolymer chain-extended with an aromatic diamine) with styrene-terminated bisphenol (and/or the tetrabromo substituted compound). It is characteristic of these compositions to be blended together, combined with reinforcing materials, and cured to prepare laminates. Such compositions are not chemically reacted until the laminates are formed. Such resins are shown to have a desirably low dielectric constant, but they exhibit low peel strength and are too brittle and improved resins have been sought.

In the parent of this application, Ser. No. 187,158, an improved thermosetting resins was disclosed which had many desirable properties. It has been found that better flame retardant properties could be obtained for laminates using such resins, but the resin-flame retardant combinations have been found to have unexpected synergistic properties, as well as seen in the discussion which follows.

SUMMARY OF THE INVENTION

An improved thermosetting resin suitable for use in laminates for the electronics industry is prepared from (a) a bisimide, preferably a bismaleimide, (b) a polyphenol, preferably a bisphenol, which may be styrene-terminated (i.e. a vinyl benzyl ether of a bisphenol), and (c) dicyandiamide. Additional flame retardant properties are achieved by including octabromodiphenyl oxide in effective amounts while retaining the desirable properties of the resin.

The resin is principally comprised of a bisimide with minor amounts of components (b) and (c). The weights of (a), (b), and (c) preferably will be between 80 to 98%/1 to 10%/0.1 to 10%, respectively, most preferably 94 to 98%/1 to 2%/1.5 to 3%, respectively, based on the total of (a), (b), and (c). The octabromodiphenyl oxide will be added in effective amounts up to about 5 weight percent based on the resin.

DESCRIPTION OF THE PREFERRED EMBODIMENTS

The thermosetting resins of the invention can replace those made by reacting a bisimide with an aromatic diamine. Such resins are polymerized and then cross-linked by use of dicyandiamide or related compounds. The present resins, however, introduce dicyandiamide as an intrinsic element of the composition, and thereby producing a superior laminate, as will be seen.

Bisimides

Bisimides are compounds having the general formula $D(CO)_2N-A-N(CO)_2D$ where D is a divalent radical containing a carbon-carbon double bond and A is a linking group which may be a divalent radical having at least 2 carbon atoms. Particularly preferred are bis-maleimide (BMI) compounds where A comprises an isopropyl radical or an ether linkage between two or more phenyl radicals which are attached to the nitrogen atoms.

For purposes of the present invention, the bisimide compound will be selected to provide resins having improved toughness, low water absorption, low dielectric constant, and excellent thermal resistance.

Resins of the invention are usually comprised mainly of the bisimide, preferably from about 80 to 98 weight %, most preferably 94 to 98 weight percent. Typically, the prepolymers of bisimides and aromatic diamines of the prior art contain smaller amounts of the bisimides than are employed in the present resins. The bisimide can react with the diamine through the unsaturated carbon-carbon bond of the imide ring, but it may also react with itself in the same manner. In the resins of the invention, a further component of the composition is dicyandiamide, which is more commonly used in other resin systems as a crosslinking agent once the bisimide and diamine have formed a prepolymer. The dicyandiamide here is believed to take an essential, although not fully understood, role in the polymer formation and not to be merely a cross-linking agent.

Dicyandiamide

This compound has the formula

It is capable of reacting with the carbon-carbon double bond of the bismaleimide to extend the polymer chain.

Only relatively small amounts of dicyandiamide are required, broadly about 0.1 to 10 wt. % of the resin may be used. Preferably, about 1.5 to 3 wt. % would be reacted to form the resin.

Polyphenols

The polyphenols used in the resins of the invention preferably are bisphenols, particularly those within the following formula:

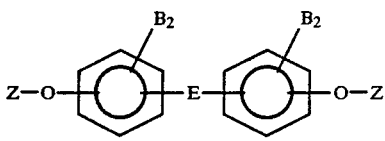

where:
Z=H, CH$_2$=CH—C$_6$H$_4$—CH$_2$—

E = CH$_3$—C—CH$_3$, OSO, —O—, HCH, —S—, and a sigma bond

B=H, Br, CH$_3$

In the above formula and those which follow, —C$_6$H$_4$— represents a phenylene radical.

Of particular interest are the group consisting of bisphenol A, tetrabromobisphenol A, vinyl benzyl ether of bisphenol A, and vinyl benzyl ether of tetrabromobisphenol A.

The polyphenols are present in the resin in minor amounts, preferably about 1 to 10 wt. %, most preferably 1 to 2 wt. %.

Composition of the Resin

A thermosetting resin composition according to the invention may comprise (a) a bisimide having the formula:

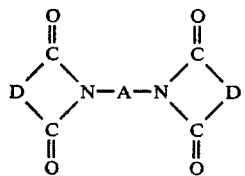

where:
A comprises at least one of alkylene radicals having 1 to 20 carbon atoms, cycloalkylene radicals having 4 to 40 carbon atoms, heterocyclic radicals containing at least one of O, S, and N, and phenylene or polycyclic aromatic radicals D is a divalent radical containing a carbon-carbon double bond (b) a bisphenol, and
(c) dicyandiamide.

In a preferred embodiment the bisimide is a bismaleimide and the thermosetting resin composition may comprise (a) a bismaleimide having the formula:

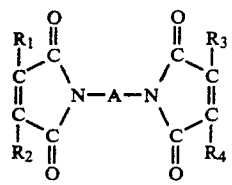

where:

A is —C$_6$H$_4$—CH$_2$—C$_6$H$_4$—, —C$_6$H$_4$—C(CH$_3$)$_2$—C$_6$H$_4$—,

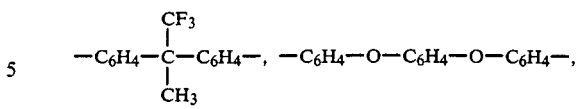

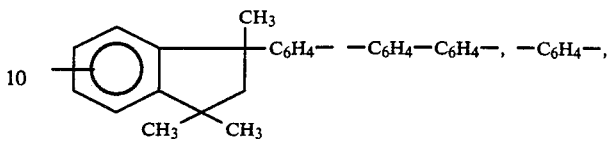

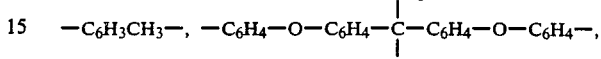

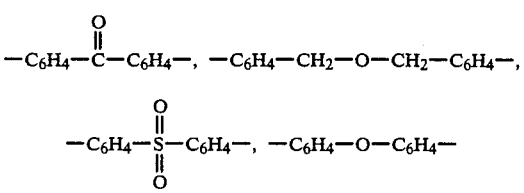

—C$_6$H$_4$—C(O)—C$_6$H$_4$—, —C$_6$H$_4$—CH$_2$—O—CH$_2$—C$_6$H$_4$—,

—C$_6$H$_4$—S(O)$_2$—C$_6$H$_4$—, —C$_6$H$_4$—O—C$_6$H$_4$—

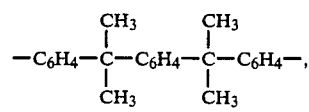

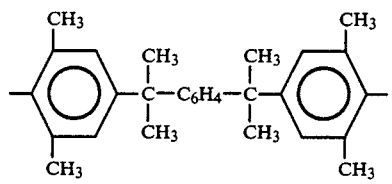

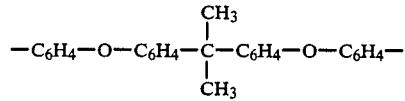

R$_1$, R$_2$, R$_3$, R$_4$ = H, CH$_3$, C$_2$H$_5$, C$_3$H$_7$, C$_4$H$_9$, C$_5$H$_{11}$ and the bisphenol has the formula

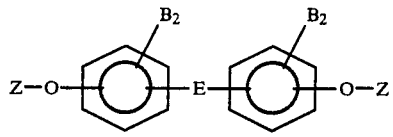

where:
Z=H, CH$_2$=CH—C$_6$H$_4$—CH$_2$—

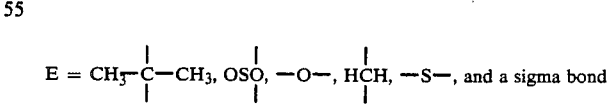

B=H, Br, CH$_3$ and (c) dicyandiamide. The term "sigma bond" refers to a covalent bond between the aromatic rings and corresponds to a bisphenol in which the aromatic rings are directly joined.

The resin composition may comprise 1–10 mols of (a), greater than zero to 1 mols of (b), and greater than zero to 2 mols of (c).

Particularly preferred embodiments include those which have bismaleimides where A is

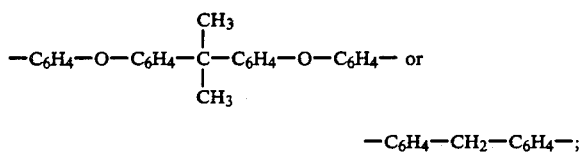

$-C_6H_4-CH_2-C_6H_4-$;

$R_1$, $R_2$, $R_3$, $R_4$ are each H; and bisphenols where Z is H or

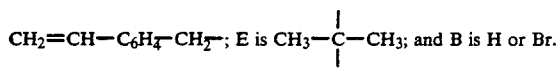

$CH_2=CH-C_6H_4-CH_2-$; E is $CH_3-\underset{|}{\overset{|}{C}}-CH_3$; and B is H or Br.

Flame Retardants

Use of bisphenols containing bromine improves flame retardant properties of laminates prepared from the above described resins. For some compositions and for some end uses it may be necessary to add additional flame retardants in order to meet required tests. The inventors have discovered that, contrary to experience with epoxy-based laminates, that bismaleimide-based laminates respond differently to the addition of bromine containing compounds. In particular, certain compounds are not sufficiently effective and/or may adversely affect other properties of the laminates. Generally, the amount of bromine present in the finished laminate does not predict the results of the usual flammability tests. It has been found that octabromodiphenyl oxide is capable of providing laminates which meet the UL-94 test for flammability while retaining the other physical properties characteristic of the bismaleimide-bisphenol-dicyandiamide resins described above. Sufficient amounts of the octabromodiphenyl oxide are added to the resin formulation to meet the UL-94 test for flammability, up to a maximum of about 5 weight percent, after which the other physical properties are adversely affected. Octabromodiphenyl oxide is commercially available from Great Lakes Chemical Corporation and is diphenyl oxide which has been brominated to have predominately eight atoms of bromine per molecule.

Resin Synthesis

The improved bismaleimide resins may be prepared by reacting the three components in a solvent at an elevated temperature to form a prepolymer. One convenient procedure is to warm a suitable solvent, such as dimethyl formamide (DMF), N-methylpyrrolidone, dimethyl acetamide, acetone, benzene, toluene, and the like to a temperature at which the chosen bismaleimide will be dissolved, say about 90° to 100° C. The bismaleimide is added to the solvent and mixed until dissolved. Then the temperature is increased to the desired reaction temperature, about 120° to 140° C., at which time the second and third components are added and mixed. The three-component mixture in the solvent will be maintained at the reaction temperature for a sufficient period of time to partially complete the reaction. Polymerization is completed during the manufacture of laminates. The octabromodiphenyl oxide is added before impregnating the reinforcing fibers.

Use of the Resins

The resins of the invention may be used to prepare laminates for the electronics industry by techniques generally in use in the field. Generally, the resins are diluted with a solvent and then used to impregnate a fabric with fibers of glass, high strength organic polymers, and the like familiar to those skilled in the art, and then dried at an elevated temperature. The resulting composite may then be laminated with other layers, such as copper foil, and then baked to fully cure the finished laminate. Such laminates may be used in fabrication of printed circuit boards having improved properties.

In the following examples, unless otherwise specified, the resins were prepared by this procedure. Dimethylformamide (DMF) was added to a glass flask and heated to 100° C. The bismaleimide resin (Skybond 3000 supplied by Monsanto) was added to the DMF and the temperature returned to 100° C., when dicyandiamide and the bisphenol ("STTBBPA", a styrene terminated tetrabromo bisphenol A, i.e., a vinyl benzyl ether of a brominated bisphenol A) were added to the mixture. The flask was heated to 140° C. and maintained at that temperature until the desired degree of reaction is reached. This was determined by sampling the mixture and determining the gel time by stroke cure method on a cure plate. When the resin had a gel time of about 6–7 minutes at 171° C., the reaction was stopped by cooling the flask. The flame retardent compounds were added and the resin was then ready for use.

EXAMPLE I

A series of laminates were prepared with varying amounts of two bromine flame-retardant compounds, octabromo diphenyl oxide according to the invention (samples 1-3) and for comparison tetrabromobisphenol A (samples 4-6). The composition of each resin, its processing into laminate, and the results of tests on the laminates are shown in the following tables.

TABLE A

|  | 1 | 2 | 3 |
|---|---|---|---|
| Composition |  |  |  |
| Bismaleimide, grs. | 562 | 645 | 562 |
| STTBBPA, grs | 25 | 29 | 25 |
| Dicyandiamide, grs. | 11 | 13 | 11 |
| Octobromodiphenyl Oxide, grs. | 18 | 35 | 42 |
| Dimethylformamide, grs. | 546 | 640 | 568 |
| Processing |  |  |  |
| Resin Solids | 53% | 53% | 53% |
| Bromine % per Solids | 4.02% | 5.52% | 6.83% |
| Resin Gel Time at 171 deg. C. | 355 sec. | 357 sec. | 367 sec. |
| Resin Content 108 glass style | 60.6% | 62.3% | 61.6% |
| Resin Content 7628 style glass | 39.5% | 40.8% | 38.8% |
| Cure Time at 176 deg. C. | 4 min. | 4 min. | 4 min. |
| Press Cycle at 176 deg. C. | 2-½ hrs. | 2-½ hrs. | 2-½ hrs. |
| Postbake at 218 deg. C. | 16 hrs. | 16 hrs. | 16 hrs. |
| Test Results |  |  |  |
| Bromine % | 4.02 | 5.52 | 6.83 |
| Resin % (1) | 59.1 | 62.2 | 60.6 |
| Flow % (1) | 26.3 | 29.6 | 26.4 |
| Volatile % (1) | 2.80 | 3.58 | 4.57 |
| Flammability-A (2) |  |  |  |
| average | 3.2 | 1.0 | 0.7 |
| single high | 8.4 | 3.9 | 2.0 |
| Solder Blister-550 F (3) | 1169 | 1044 | 1165 |

(1) Style 108 glass bonding sheet, target 62% ± 5% resin; 30% ± 5% flow; 4% maximum for volatiles
(2) 8 ply style 7628 glass Target flammability values are 2.5 seconds average and 5.0 seconds maximum for any one test.
(3) 5 mil thickness, 2 ply style 108 glass, 1 oz copper both sides, target 600 seconds

TABLE B

| | 1 | 2 | 3 |
|---|---|---|---|
| Composition | | | |
| Bismaleimide, grs. | 562 | 595 | 666 |
| STTBBPA, grs | 25 | 27 | 30 |
| Dicyandiamide, grs. | 11 | 12 | 13 |
| Tetrabromobiphenol A, grs. | 26 | 43 | 68 |
| Dimethylformamide, grs. | 552 | 600 | 688 |
| Processing | | | |
| Resin Solids | 53% | 53% | 53% |
| Bromine % per Solids | 4.05% | 5.42% | 6.79% |
| Resin Gel Time at 171 deg. C. | 309 sec. | 300 sec. | 275 sec. |
| Resin Content 108 glass style | 60.9% | 60.7% | 61.0% |
| Resin Content 7628 style glass | 41.7% | 40.3% | 42.6% |
| Cure Time at 176 deg. C. | 3-½ min. | 3-½ min. | 3-½ min. |
| Press Cycle at 176 deg. C. | 2-½ hrs. | 2-½ hrs. | 2-½ hrs. |
| Postbake at 218 deg. C. | 16 hrs. | 16 hrs. | 16 hrs. |
| Test Results | | | |
| Bromine % | 4.05 | 5.42 | 6.79 |
| Resin % (1) | 60.0 | 59.5 | 59.3 |
| Flow % (1) | 26.0 | 26.7 | 28.3 |
| Volatile % (1) | 3.36 | 4.48 | 5.87 |
| Flammability-A (2) | | | |
| average | 3.0 | 3.3 | 2.3 |
| single high | 9.2 | 11.0 | 8.1 |
| Solder Blister-550 F (3) | 498 | 215 | 7 |

(1) Style 108 glass bonding sheets, target 62% ± 5% resin; 30% ± 5% flow; 4% maximum for volatiles
(2) 8 ply style 7628 Glass, Target flammability values are 2.5 seconds average and 5.0 seconds maximum for any one test.
(3) 5 mil thickness, 2 ply style 108 glass, 1 oz. copper both sides, target 600 seconds It can be seen from Table A that increasing the amount of octabromodiphenyl oxide reduces the flammability test results to within the target range, while the solder blister test apparently is not significantly affected. However, tetrabromobisphenol, even at about the same total bromine content does not reduce the flammability results effectively but at the same time reduces the solder blister test and percent volatiles results to unacceptable values. It is concluded that the octabromo-diphenol oxide is uniquely effective as a flame retardant additive for the bismaleimide-based resins of the invention.

What is claimed:

1. A thermosetting resin composition consisting essentially of
   (a) a bisimide having the formula:

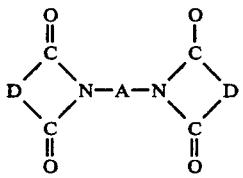

where:
   A comprises at least one of alkylene radicals having 1 to 20 carbon atoms, cycloalkylene radicals having 4 to 40 carbon atoms, heterocyclic radicals containing at least one of O, S, or N, phenylene or polycyclic aromatic radicals.
   D is a divalent radical containing a carbon-carbon double bond
   (b) a polyphenol;
   (c) dicyandiamide, where the weight of (a), (b), and (c) are 80 to 98%/1 to 10%/and 0.1 to 10%, respectively, based on the total weight of (a), (b), and (c) and (d) octabromodiphenyl oxide in an effective amount up to about 5 weight percent.

2. A thermosetting resin composition consisting essentially of:
   (a) a bismaleimide;
   (b) a bisphenol or a vinyl benzyl ether of a bisphenol;
   (c) dicyandiamide, and
   (d) octabromodiphenyl oxide where the weight of (a), (b), and (c) are 80 to 98%/1 to 10%/and 0.1 to 10%, respectively, based on the total weight of (a), (b), and (c) and (d) is present in an effective amount up to about 5 weight percent.

3. A thermosetting resin of claim 1 wherein the weights of (a), (b), and (c) are 94 to 98%/1 to 2%/and 1.5 to 3% respectively.

4. A thermosetting resin composition of claim 2 wherein (a) is:

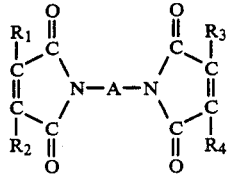

where:

A is $-C_6H_4-CH_2-C_6H_4-$, $-C_6H_4-\underset{\underset{CH_3}{|}}{\overset{\overset{CH_3}{|}}{C}}-C_6H_4-$, $-C_6H_4-\underset{\underset{CH_3}{|}}{\overset{\overset{CF_3}{|}}{C}}-C_6H_4-$, $-C_6H_4-O-C_6H_4-O-C_6H_4-$,

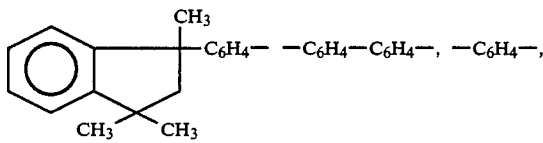

$-C_6H_3CH_3-$, $-C_6G_4-O-C_6H_4-\underset{\underset{CF_3}{|}}{\overset{\overset{CF_3}{|}}{C}}-C_6H_4-O-C_6H_4-$,

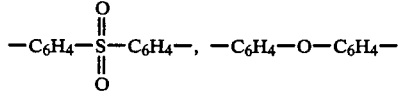

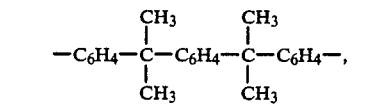

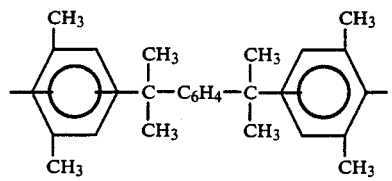

-continued

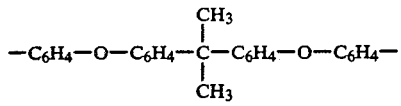

R₁, R₂, R₃, R₄ are H, CH₃, C₂H₅, C₃H₇, C₄H₉, C₅H₁₁

(b) is

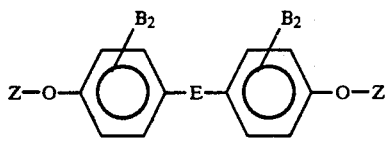

where: Z is H, CH₂=CH—C₆H₄—CH₂—
E is a covalent bond or E represents

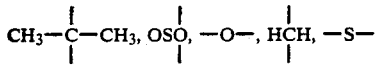

B is H, Br, CH₃.

5. A thermosetting resin composition of claim 4 wherein (a) is

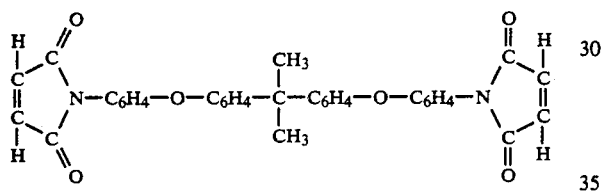

and (b) is:

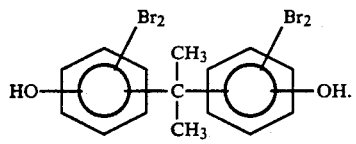

6. A flame resistant laminate comprising a reinforcing fabric and a thermosetting resin composition consisting essentially of:
(a) a bismaleimide;
(b) a bisphenol or a vinyl benzyl ether of a bisphenol;
(c) dicyandiamide, and
(d) octabromodiphenyl oxide where the weight of (a), (b), and (c) are 80–98%/1 to 10%/ and 0.1 to 10% respectively and (d) is present in an effective amount up to about 5 weight percent.

7. The flame retardant laminate of claim 6 wherein (a) is:

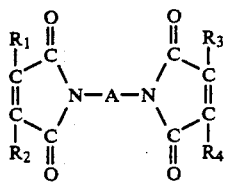

where:

A is , 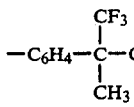,

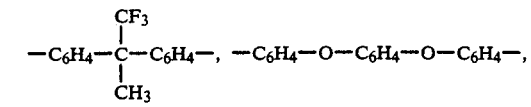

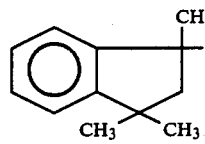

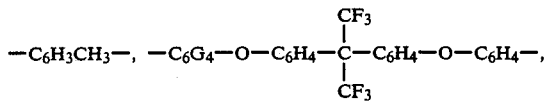

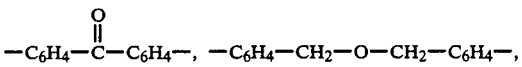

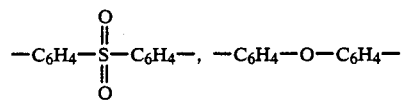

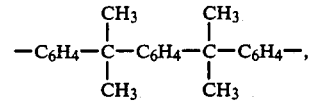

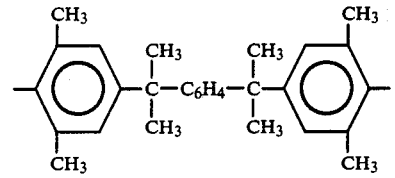

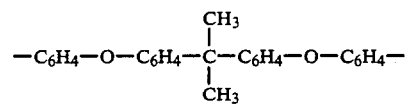

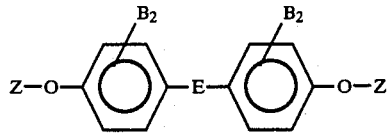

R₁, R₂, R₃, R₄ are H, CH₃, C₂C₅, C₃H₇, C₄H₉, C₅H₁₁

(b) is

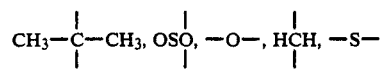

where:
Z is H, CH₂=CH—C₆H₄—CH₂—

E is a covalent bond or E represents

CH₃—C̣—CH₃, OṢO, —O—, HĊH, —S—

B is H, Br, CH₃.

8. A flame retarding laminate of claim 7 wherein (a) is

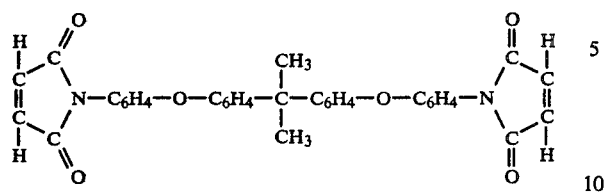
and (b) is:
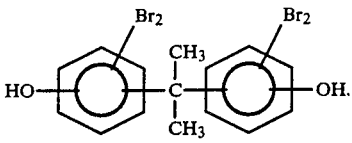
9. A flame retarding laminate of claim 6 wherein said reinforcing fabric includes glass fibers.
10. A printed circuit board comprising the flame resistant laminate of any one of claims 6–9.
* * * * *